United States Patent
Girot et al.

(10) Patent No.: US 8,089,303 B2
(45) Date of Patent: Jan. 3, 2012

(54) HIGH-VOLTAGE SOLID-STATE SWITCH

(75) Inventors: Dominique Girot, Clerieux (FR); Hervé Carton, Livron (FR)

(73) Assignee: Crouzet Automatismes, Valence (FR)

( * ) Notice: Subject to any disclaimer, the term of this patent is extended or adjusted under 35 U.S.C. 154(b) by 0 days.

(21) Appl. No.: 12/654,870

(22) Filed: Jan. 7, 2010

(65) Prior Publication Data
US 2010/0182071 A1    Jul. 22, 2010

(30) Foreign Application Priority Data

Jan. 20, 2009  (FR) ..................................... 09 00242

(51) Int. Cl.
*H03K 3/00* (2006.01)
(52) U.S. Cl. .......... 327/108; 327/432; 327/433; 326/84; 326/85
(58) Field of Classification Search ................... 327/108, 327/432, 433; 326/84, 85
See application file for complete search history.

(56) References Cited

U.S. PATENT DOCUMENTS

| | | | | |
|---|---|---|---|---|
| 5,153,457 A * | 10/1992 | Martin et al. | ................... | 326/84 |
| 5,291,082 A | 3/1994 | Revillet et al. | ................ | 307/570 |
| 5,396,117 A | 3/1995 | Housen et al. | ................ | 327/480 |
| 5,432,471 A * | 7/1995 | Majumdar et al. | ............ | 327/380 |
| 5,999,041 A * | 12/1999 | Nagata et al. | ................. | 327/538 |
| 6,404,173 B1 | 6/2002 | Telefus | ......................... | 323/272 |
| 6,643,112 B1 | 11/2003 | Carton et al. | ................. | 361/152 |
| 7,218,496 B2 * | 5/2007 | Kitagawa | ..................... | 361/93.9 |
| 7,362,079 B1 * | 4/2008 | Maheedhar et al. | .......... | 323/269 |
| 2008/0074820 A1 | 3/2008 | Thiery | ......................... | 361/93.7 |

FOREIGN PATENT DOCUMENTS

JP    2007221473    8/2007

* cited by examiner

*Primary Examiner* — Kenneth B. Wells
(74) *Attorney, Agent, or Firm* — Steptoe & Johnson LLP

(57) ABSTRACT

A solid-state switch according to the invention is designed to be connected in series with a load. The switch comprises at least two electric switching means connected in parallel, measuring means designed to measure an electric voltage at the terminals of the electric switching means and a main current flowing in the load, and control means delivering a control signal to act on opening and closing according to the value of the main current. The state of conduction of the first electric switching means depends at the same time on the main current flowing in the load, on a control current, on a control voltage delivered by the control means, and on the gain of the first electric switching means.

7 Claims, 4 Drawing Sheets

HIGH-VOLTAGE SOLID-STATE SWITCH

BACKGROUND OF THE INVENTION

The invention relates to a high-voltage solid-state switch designed to be connected in series with a load to be protected. The switch comprises at least two electric switching means connected in parallel, measuring means designed to measure a voltage at the terminals of the electric switching means and a main current flowing in the load. The switch also comprises control means delivering a control signal to act on opening and closing of the electric switching means according to the value of the main current flowing through the load.

STATE OF THE PRIOR ART

Power components used for performing the electric switching function are widely used in particular in the aeronautics field. For example, these components can be transistors of MOSFET, IGBT, BIPOLAR or JFET type, made of silicon or silicon carbide. The switching devices used as solid-state switch are hereinafter called SSPC (Solid State Power Controller) or SSTC (Solid State Tripping Contactor).

A solid-state switch of SSPC type is designed to generally operate in two operating modes.

A first operating mode corresponds to the case where the current comprises a value lower than or equal to the rated operating current In ($I \leq In$). The SSPC switch then has to present a low voltage drop. This voltage drop at the terminals of the SSTC trip breaker is henceforth referred to as drop-off voltage. Reducing the drop-off voltage enables the losses by Joule effect in the trip breaker to be reduced. Reducing the drop-off voltage further enables the quantity of energy transferred to the load to be increased. A maximum amount of energy can be transferred to the load when the drop-off voltage is at a minimum. For example, the maximum acceptable drop-off voltage can be equal to 0.4V.

A second operating mode corresponds to the case where the current is of higher value than the rated operating current ($I>In$). The SSPC switch is generally able to withstand a high current ($I>In$) during a time that is proportionally shorter the higher the current value. This overcurrent, and the time during which it is applied, are given by the trip curve as represented in FIG. 2. For example, the maximum acceptable drop-off voltage can be equal to 2V.

The use of IGBT transistors in SSPC trip breakers is known. Use thereof is particularly dedicated to high-voltage applications. Under particular conditions of use, in particular when the temperature is equal to about 150° C. and the current is less than one tenth of the maximum current, the drop-off voltage of IGBT transistors can then not be less than 0.85 volts. This drop-off voltage is closer to 1.15V under normal operating conditions. This means that the efficiency of the cooling devices, which are heavy and voluminous, has to be increased. This constitutes a handicap for use of SSPC switches in aeronautics.

To overcome certain problems, known solutions as described in the document FR2680925, use two parallel-connected transistors. The document FR2680925 describes the use of a first transistor of bipolar type connected in parallel with an IGBT transistor. Advantageously, this type of assembly presents a low drop-off voltage. Furthermore, this type of assembly in particular presents the drawback of having a low gain. It is moreover preferable to saturate the bipolar transistor to benefit from a low drop-off voltage. This involves desaturating said bipolar transistor when the latter is opened to cut the current. The latter operation increases the operating time for switching. The assembly formed by an IGBT transistor and a bipolar transistor connected in parallel can therefore not open quickly in case of an overcurrent.

SUMMARY OF THE INVENTION

The object of the invention is therefore to remedy the drawbacks of the state of the technique so as to propose a high-voltage solid-state switch with low power losses.

The high-voltage solid-state switch according to the invention is characterized in that the state of conduction of the first electric switching means depends at the same time on the main current flowing in the load, on a control current, on a control voltage delivered by the control means, and on the gain of the first electric switching means.

According to a preferred embodiment of the invention, the first electric switching means comprise a first transistor of bipolar type connected in series with a second field effect transistor, the emitter of the first bipolar transistor being connected to the drain of the second field effect transistor.

Advantageously, the control means are connected to the base of the first bipolar transistor to deliver a regulated control current thereto, said regulated control current depending at the same time on a reference voltage, on the main current, and on a drop-off voltage measured between the collector of the bipolar transistor and the source of the second field effect transistor. The control means are connected to the gate of the second field effect transistor to deliver a control signal thereto.

According to a preferred embodiment of the invention, the first switching means comprise a transistor of ESBT® type.

Advantageously, the control means are connected to the base of the ESBT® transistor to deliver a regulated control current thereto, said regulated control current depending at the same time on a reference voltage, on the main current, and on a drop-off voltage measured between the collector and source of said transistor. The control means are connected between the base and source of said transistor to deliver a control signal thereto.

According to the embodiments of the invention, the second electric switching means comprise a third transistor.

Advantageously, the third transistor is an insulated gate bipolar transistor IGBT, the control means being connected to the gate of said insulated gate bipolar transistor IGBT to deliver a control signal thereto.

Advantageously, the third transistor is a MOSFET field effect transistor, the control means being connected to the gate of said field effect transistor to deliver a control signal thereto.

BRIEF DESCRIPTION OF THE DRAWINGS

Other advantages and features will become more clearly apparent from the following description of particular embodiments of the invention, given as non-restrictive examples only and represented in the accompanying drawings in which.

DETAILED DESCRIPTION OF AN EMBODIMENT

High-voltage solid-state switching device 1 according to the invention comprises at least two electric switching means 2A, 2B connected in parallel. Said at least two electric switching means are of different technology. In other words, the electric switching means respectively connected in parallel are different from one another. The solid-state switching device is designed to be connected to a load 3. Measuring means 4 are designed to measure an electric voltage Vcs at the terminals of electric switching means 2A, 2B and a main current Ic flowing in load 3. Measuring means 4 are connected to control means 5.

In known manner, control means 5 are designed to deliver a control signal Vcom, Ib to act on opening and closing of electric switching means 2A, 2B according to the value of main current Ic flowing in load 3. The state of conduction of first electric switching means 2A is thus dependent both on main current Ic flowing in load 3 and on gain Hfe of first electric switching means 2A.

According to an embodiment of the invention, control means 5 are connected to first electric switching means 2A in such a way that the state of conduction of said first electric switching means 2A depends both on a control current Ib and on a control voltage Vcom delivered by control means 5.

Figure 1:
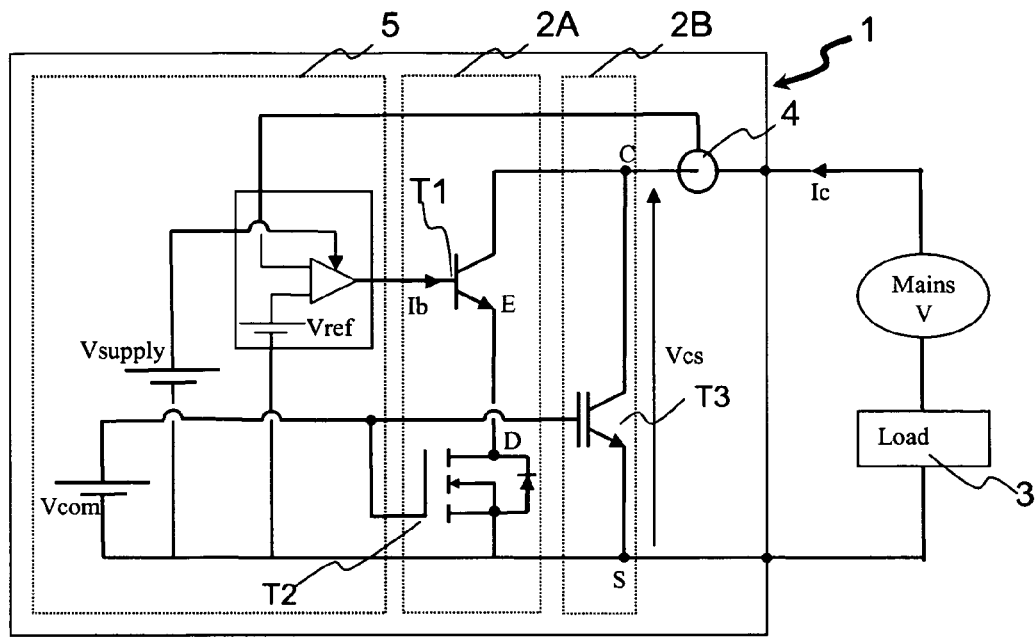
FIG. 1 represents a wiring diagram of a high-voltage solid-state switch according to a first preferred embodiment of the invention.
Figure 2:
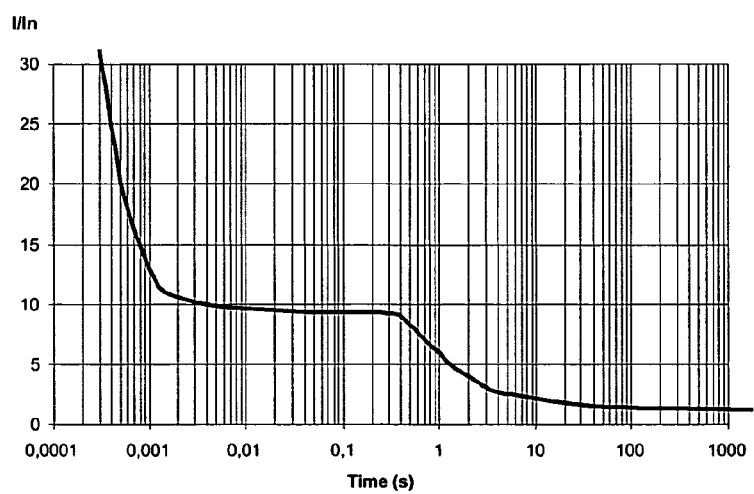
FIG. 2 represents a trip curve of a solid-state switch according to FIG. 1.

According to a first preferred embodiment of the invention represented in FIG. 1, first electric switching means 2A comprise an assembly of CASCODE type comprising two transistors T1, T2. A first bipolar transistor T1 is connected in series with a second field effect transistor T2 (of MOSFET type). Emitter E of first bipolar transistor T1 is connected to drain D of second field effect transistor T2. Control means 5 are designed to deliver a control signal Vcom to the gate of second field effect transistor T2.

According to this preferred embodiment of the invention, third transistor T3 is preferably an insulated gate bipolar transistor IGBT.

Control means 5 are electrically connected to transistors T1, T2, T3. Control means 5 are in fact connected to the base of first bipolar transistor T1 to deliver a regulated control current Ib thereto. Said regulated control current Ib is dependent at the same time on a reference voltage Vref, on main current Ic, and on a drop-off voltage Vcs measured between collector C of first bipolar transistor T1 and source S of second MOSFET field effect transistor T2. Control means 5 are also connected to the gate of second MOSFET field effect transistor T2 to deliver a control signal Vcom thereto. Control means 5 are connected to the gate of said IGBT bipolar transistor to deliver a control signal Vcom thereto.

Figure 3A:
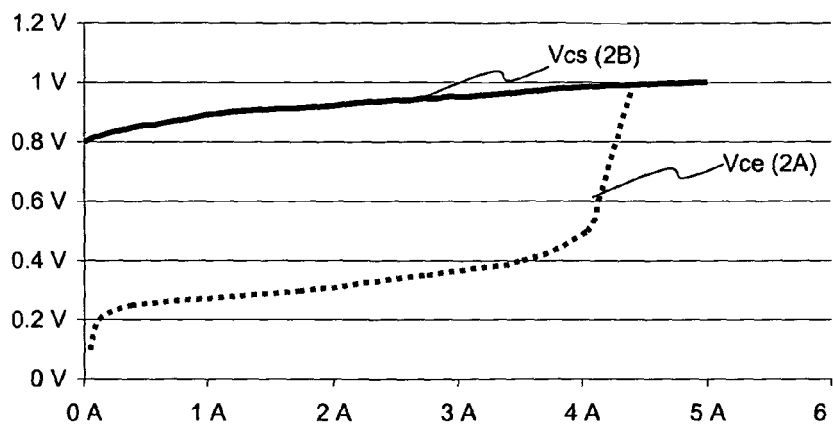
FIG. 3A represents the curve plots of the drop-off voltage of the switching means of a solid-state switch according to FIG. 1.

The operating principle of second electric switching means 2B comprising third transistor T3 is as follows. Second electric switching means 2B is turned on when control means 5 deliver a control voltage Vcom. As represented in FIG. 3A, its drop-off voltage Vcs which can be as high as 1 Volt is great, but said second switching means 2B has the advantage of being able to conduct a main current Ic of high value, in particular greater than the rated current.

The operating principle of first electric switching means 2A comprising the CASCODE assembly is different from that of second electric switching means 2B. The state of conduction of first electric switching means 2A (off, limited or saturated) depends at the same time on main current Ic flowing in load 3, on control current Ib, on control voltage Vcom, and on gain Hfe of bipolar transistor T1.

First electric switching means 2A is turned on when a control voltage Vcom is present and a control current Ib supplies the base of first bipolar transistor T1. MOSFET transistor T2 is turned on if control voltage Vcom is applied. It then behaves as a resistor having a given value Ron. The internal resistance value Ron is for example 0.08 ohms in this first embodiment.

As represented in FIG. 3A as an example embodiment, drop-off voltage Vce of first electric switching means 2A is then comprised between 0.1V and 0.5V and can be considered to be low. For currents higher than rated current In (In=4A), the drop-off voltage tends to increase very rapidly.

Bipolar transistor T1 has an operating mode as described hereunder.

Bipolar transistor T1 is saturated if control current Ib is greater than the ratio Ic/Hfe between main current Ic and gain Hfe. For example, according to the embodiment of the invention, drop-off voltage Vce can then be less than 0.3 volts.

Bipolar transistor T1 is turned-on if control current Ib is both greater than 0 and smaller than the ratio Ic/Hfe between main current Ic and gain Hfe. Drop-off voltage Vce then tends to increase.

Bipolar transistor T1 is turned-off if control current Ib is equal to 0.

One solution to keep a lowest possible drop-off voltage Vce would therefore consist in keeping first bipolar transistor T1 saturated. To do this, the value of control current Ib would then have to be increased. This solution would not be economical as the electric circuit would have to be dimensioned such as to be able to supply a sufficient maximum control current Ib for the regulation to be able to withstand main currents Ic greater than rated current In.

Figure 4:
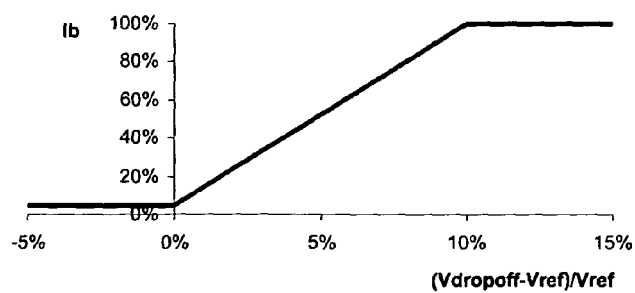
FIG. 4 represents a curve plot of the control current of a solid-state switch according to FIG. 1.

According to an operating mode of the embodiments of the invention, the choice was made of working with a constant drop-off voltage Vce and of regulating current Ib. Control current Ib is increased when drop-off voltage Vce is greater than a reference voltage Vref, and Ib is reduced when drop-off voltage Vce is lower than reference voltage Vref. As represented in FIG. 4, the value of control current Ib is bounded between a minimum and a maximum value. A first minimum value is very low to keep first bipolar transistor T1 turned-on even if load 3 does not consume any main current Ic. A second maximum value is sufficient for the regulation to be able to operate up to a rated current In, but not beyond.

In the operating mode of the invention, control current Ib therefore follows a variation proportional to the value of main current Ic. Control current Ib is kept slightly lower than the ratio Ic/Hfe between main current Ic and gain Hfe. First bipolar transistor T1 is then not completely saturated.

According to a particular embodiment, with a rated current In substantially equal to 4 Amps, the drop-off voltage used for regulation could be chosen between 0.25V and 1V. These values are defined in the following manner: the minimum of 0.25V is the lowest value that transistors T1, T2 of the CASCODE assembly can guarantee, and the maximum of 1V is the value that is able to be guaranteed by third IGBT transistor T3.

The choice of the value of drop-off voltage Vce for regulation is determined according to the total electric losses when main current Ic is equal to rated current In. Operation of the device is sought to be optimized by minimizing these total electric losses. When main current Ic is equal to or less than rated current In, there is no current in IGBT transistor T3. The total electric losses in first switching means 2A are composed on the one hand of direct electric losses in transistors T1, T2 of the CASCODE assembly and on the other hand of electric losses due to control of first bipolar transistor T1. The direct electric losses in the CASCODE assembly are equal to the product of drop-off voltage Vce of first switching means 2A multiplied by main current Ic (Vce×Ic). The electric losses due to control of first bipolar transistor T1 are equal to the product of supply voltage Vsupply of the circuit generating control current Ib at the base of first bipolar transistor T1 multiplied by control current Ib (Vsupply×Ib).

Thus, if it is sought to reduce drop-off voltage Vce by increasing control current Ib, the electric losses due to control of first bipolar transistor T1 will then increase. In other words, by reducing the direct electric losses, there is a tendency to increase the electric losses due to control. An optimum value therefore exists where the total electric losses are lowest. For non-restrictive example purposes, regulation of drop-off voltage Vce of first switching means 2A is comprised between 0.3 and 0.4 V.

Figure 3B:
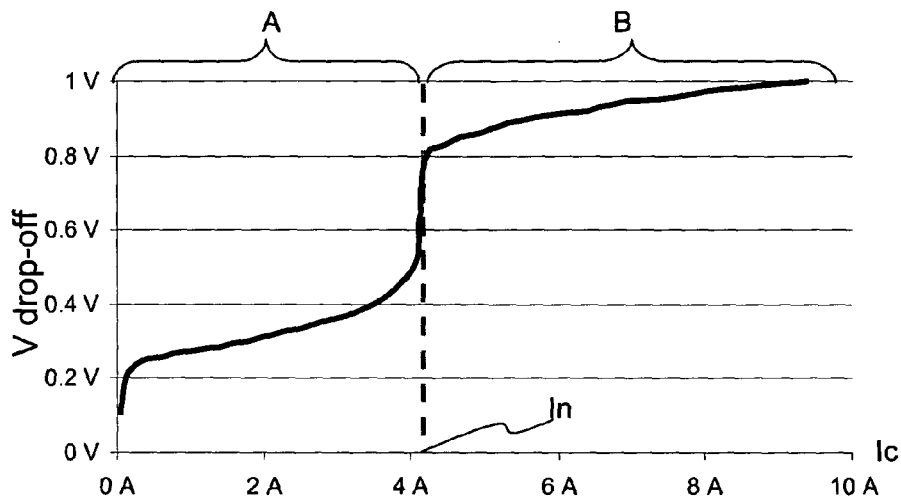
FIG. 3B represents a curve plot of the drop-off voltage of a solid-state switch according to FIG. 1.

Operation of control means 5 is as follows:

As represented in FIG. 3B, when a main current Ic flowing in load 3 is lower than the value of rated current In (zone A), said main current Ic then flows mainly in first switching means 2A. The minimum value of drop-off voltage Vcs of third transistor T3 prevents the current from flowing in said third transistor T3.

As represented in FIG. 3B, when a main current Ic flowing in load 3 is comprised between the value of rated current In and a short-circuit current Isc (zone B), said main current Ic then flows in both first and second switching means 2A, 2B. Distribution of main current Ic in electric switching means 2A, 2B is performed as follows: a current with a value about equal to that of rated current In flows in first switching means 2A and a current with a value about equal to that of the difference between main current Ic and rated current In (Ic−In) flows in second switching means 2B.

Figure 5:
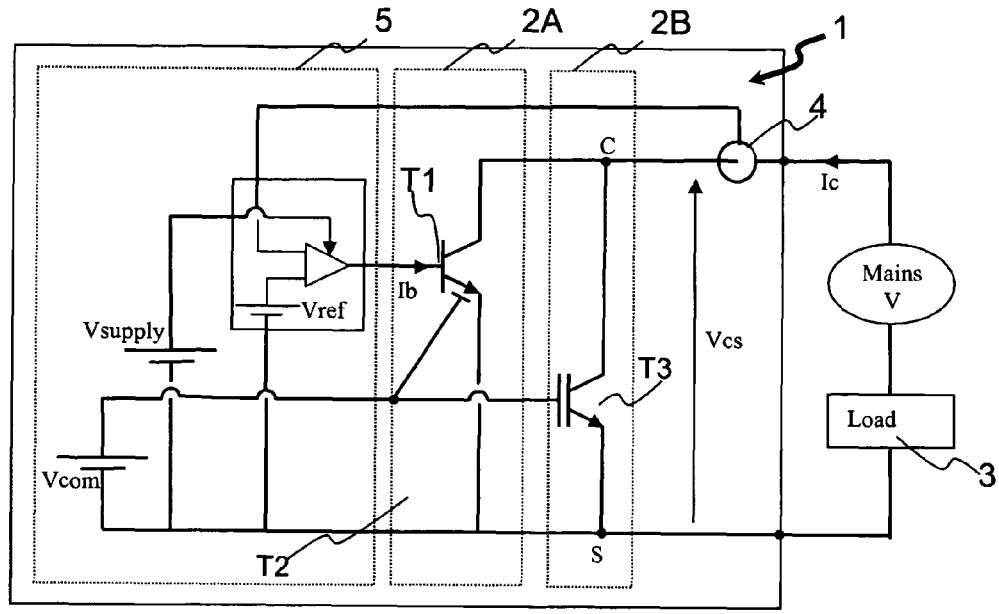
FIG. 5 represents a wiring diagram of a high-voltage solid-state switch according to a second preferred embodiment of the invention.

According to a second mode preferred embodiment of the invention represented in FIG. 5, first bipolar transistor T1 connected in series with second MOSFET transistor T2 in a CASCODE assembly is advantageously replaced by a transistor of ESBT® (Emitter-Switched Bipolar Transistor) type. First electric switching means 2A then comprise a single ESBT® transistor which then integrates the functionalities of first and second transistor T1, T2. Control means 5 are connected to the base of ESBT® transistor to deliver a regulated control current Ib thereto. Said regulated control current Ib is then dependent both on a reference voltage Vref, on main current Ic and on a drop-off voltage Vcs measured between collector C and source S of said transistor. Control means 5 are connected between the base and source of said transistor to deliver a control signal Vcom thereto.

As for the CASCODE assembly described above, the operating principle of the ESBT® transistor is as follows: the latter is turned-on when control voltage Vcom is present and a control current Ib is supplied thereto. Its state of conduction (off, limited or saturated) depends on the value of main current Ic, on control current Ib, and on gain Hfe of said transistor.

Figure 6:
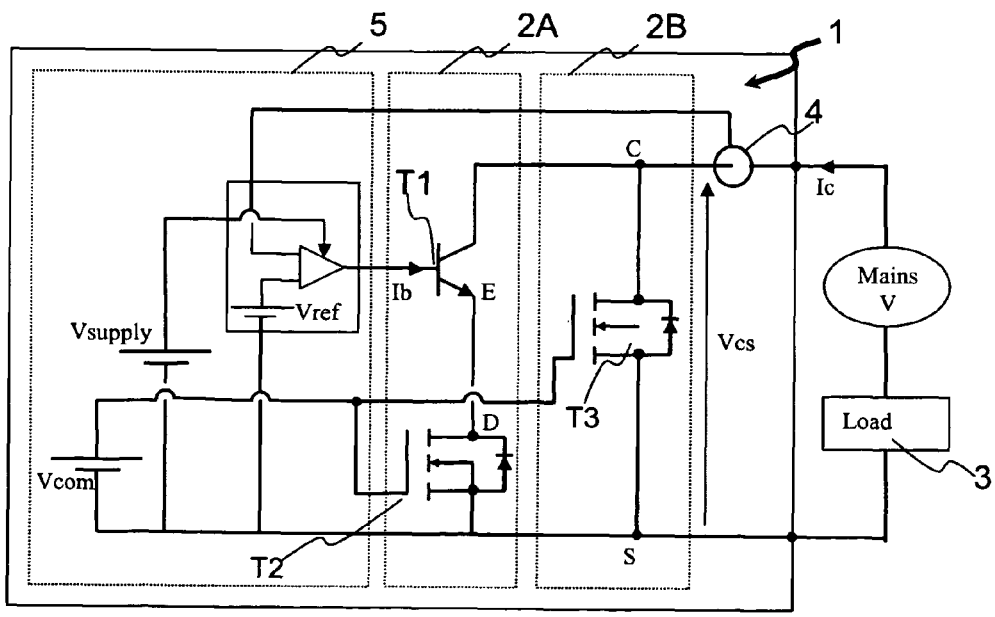
FIG. 6 represents an alternative embodiment of the first and second preferred embodiment according to FIGS. 1 and 5.

According to a variant of the two preferred embodiments of the invention represented in FIG. 6, first electric switching means 2A comprise either a CASCODE assembly having first and second transistors T1, T2 or an ESBT® transistor. Second electric switching means 2B comprise a third MOSFET field effect transistor T3 instead of an IGBT transistor.

Control means 5 are connected to the gate of said field effect transistor to deliver a control signal Vcom thereto. Control of the first electric switching means is identical to that of the two preferred modes described above.

Third MOSFET transistor T3 of second switching means 2B is turned-on if control voltage Vcom is applied. It then behaves as an internal resistance having a given value Ron. Resistance value Ron is for example 0.12 ohms in this embodiment example. Said transistor has a linear behaviour.

Figure 7:
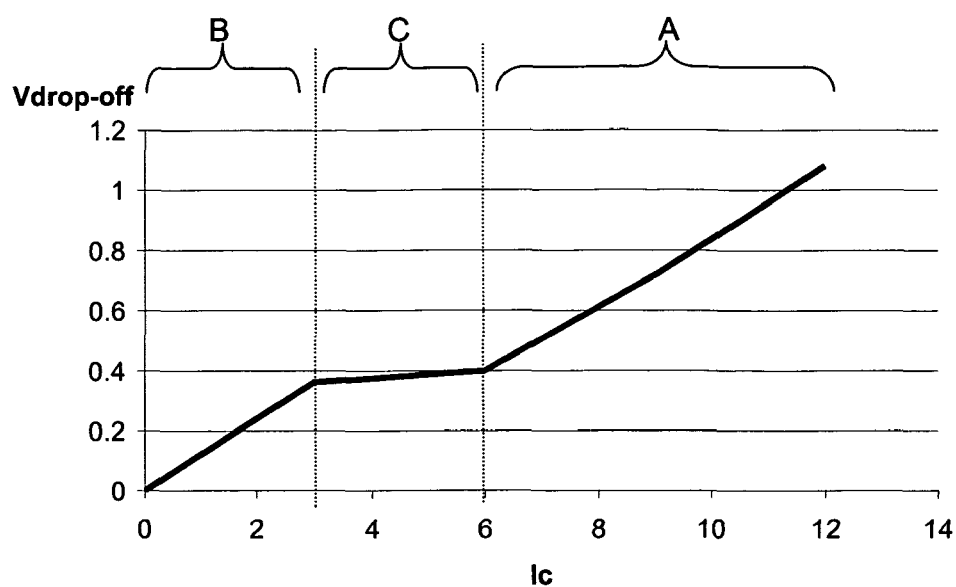
FIG. 7 represents a curve plot of the drop-off voltage of a solid-state switch according to FIG. 6.

Operation of the control means is as follows:

As represented in FIG. 7, when drop-off voltage Vce is regulated between 0 and 0.3V (Zone A), the whole of main current Ic flows in second switching means 2B.

As represented in FIG. 7, when drop-off voltage Vce is regulated between 0.3 and 0.4V (Zone C), the current in second switching means 2B changes little and the current flowing in first switching means 2A tends to increase.

Finally, when drop-off voltage Vce is greater than 0.4V (Zone B), the current in first switching means 2A does not increase and the excess additional current flows in second switching means 2B. In the latter configuration, the electric current in first switching means 2A is approximately equal to rated current In, and the current in second switching means 2B is approximately equal to (Ic−In).

The invention claimed is:

1. A high-voltage solid-state switch connected in series with a load to be protected, comprising:
at least two electric switching means connected in parallel, the at least two electric switching means of different technologies,
measuring means for measuring an electric voltage at the terminals of the at least two electric switching means, and a main current flowing in the load, and
control means connected to the measuring means for delivering a control signal for causing one of the at least two electric switching means to open or close according to the value of a main current flowing in the load,
wherein the control means is connected to a first electric switching means among the at least two electric switching means so that the state of conduction of said first electric switching means depends both on a regulated control current and on a control voltage corresponding to the control signal delivered by said control means,
wherein the first electric switching means comprises a first transistor connected in series with a second transistor, wherein the first transistor comprises a bipolar transistor, and the second transistor comprises a field effect transistor, and the emitter of the first transistor is connected to the drain of the second transistor, and
the control means is connected to the base of the first transistor to deliver a regulated control current thereto, and to the gate of the second transistor to deliver the control voltage thereto.

2. The solid-state switch according to claim 1, wherein said regulated control current is simultaneously dependent on a reference voltage, the main current, and a drop-off voltage measured between the collector of the first transistor and the source of the second transistor.

3. The solid-state switch according to claim 1, wherein the first electric switching means comprises an ESBT transistor, the control means being connected to the base of the ESBT transistor to deliver the regulated control current thereto, and between the base and source of said ESBT transistor to deliver the control voltage thereto.

4. The solid-state switch according to claim 3, wherein said regulated control current is simultaneously dependent on a reference voltage, the main current, and a drop-off voltage measured between the collector and the source of the ESBT transistor.

5. The solid-state switch according to claim 1, wherein a second electric switching means of the at least two electric switching means comprises a third transistor, and the control means is connected to said transistor to deliver a control voltage thereto.

6. The solid-state switch according to claim 5, wherein the third transistor is an insulated gate bipolar transistor, the control means being connected to the gate of said insulated gate bipolar transistor to deliver a control voltage thereto.

7. The solid-state switch according to claim 5, wherein the third transistor is a MOSFET field effect transistor, the control means being connected to the gate of said field effect transistor to deliver a control voltage thereto.

* * * * *